(12) United States Patent
Chiou et al.

(10) Patent No.: US 10,119,875 B2
(45) Date of Patent: Nov. 6, 2018

(54) PRESSURE SENSOR DEVICE WITH A MEMS PIEZORESISTIVE ELEMENT ATTACHED TO AN IN-CIRCUIT CERAMIC BOARD

(71) Applicant: Continental Automotive Systems, Inc., Auburn Hills, MI (US)

(72) Inventors: Jen-Huang Albert Chiou, Libertyville, IL (US); Benjamin C. Lin, Barrington, IL (US); Eric Matthew Vine, Chicago, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 330 days.

(21) Appl. No.: 15/181,975

(22) Filed: Jun. 14, 2016

(65) Prior Publication Data

US 2016/0377496 A1 Dec. 29, 2016

Related U.S. Application Data

(60) Provisional application No. 62/185,823, filed on Jun. 29, 2015.

(51) Int. Cl.
*G01L 19/04* (2006.01)
*G01L 9/00* (2006.01)
(Continued)

(52) U.S. Cl.
CPC ............... *G01L 9/008* (2013.01); *G01B 7/16* (2013.01); *G01L 9/0044* (2013.01);
(Continued)

(58) Field of Classification Search
None
See application file for complete search history.

(56) References Cited

U.S. PATENT DOCUMENTS 5,600,071 A * 2/1997 Sooriakumar ........ G01L 9/0055
73/721
7,243,552 B2 7/2007 Vas et al.
(Continued)

FOREIGN PATENT DOCUMENTS

DE 102007052364 A1 5/2009
GB 2394055 A 4/2004
(Continued)

OTHER PUBLICATIONS

International Search Report and Written Opinion dated Sep. 13, 2016 from corresponding International Patent Application No. PCT/US2016/037656.
(Continued)

*Primary Examiner* — Peter Macchiarolo
*Assistant Examiner* — Jermaine Jenkins

(57) ABSTRACT

A pressure sensor device with a MEMS piezoresistive pressure sensing element attached to an in-circuit ceramic board comprises a monolithic ceramic circuit board formed by firing multiple layers of ceramic together. The bottom side of the circuit board has a cavity, which extends through layers of material from the ceramic circuit board is formed. A ceramic diaphragm, which is one of the layers, has a peripheral edge. The diaphragm's thickness enables the diaphragm bounded by the edge to deflect responsive to applied pressure. A MEMS piezoresistive pressure sensing element attached to the top side of the ceramic circuit board generates an output signal responsive to deflection of the ceramic diaphragm. A conduit carrying a pressurized fluid (liquid or gas) can be attached directly to the ceramic circuit board using a seal on the bottom of the ceramic circuit board, which surrounds the opening of the cavity through the bottom.

16 Claims, 6 Drawing Sheets

(51) Int. Cl.
    *G01L 19/00*     (2006.01)
    *G01L 19/14*     (2006.01)
    *G01B 7/16*     (2006.01)

(52) U.S. Cl.
    CPC ........ *G01L 9/0055* (2013.01); *G01L 19/0007* (2013.01); *G01L 19/0076* (2013.01); *G01L 19/04* (2013.01); *G01L 19/148* (2013.01); *H01L 2224/48091* (2013.01); *H01L 2224/73265* (2013.01)

(56) References Cited

U.S. PATENT DOCUMENTS

| | | | |
|---|---|---|---|
| 7,353,711 B2 * | 4/2008 | O'Dowd | G01L 9/0072 73/718 |
| 7,421,773 B2 | 9/2008 | Vas et al. | |
| 9,541,461 B2 * | 1/2017 | Cogliati | G01L 9/0044 |
| 2004/0200291 A1 | 10/2004 | Dai et al. | |
| 2010/0005894 A1 | 1/2010 | Partsch | |
| 2012/0266684 A1 * | 10/2012 | Hooper | G01L 9/0052 73/721 |
| 2016/0209344 A1 * | 7/2016 | Lee | H01L 25/16 |
| 2017/0343430 A1 * | 11/2017 | Caltabiano | G01L 1/18 |

FOREIGN PATENT DOCUMENTS

| | | |
|---|---|---|
| WO | 02/061383 A1 | 8/2002 |
| WO | 2011/104860 A1 | 9/2011 |

OTHER PUBLICATIONS

English J M et al., "Wireless micromachined ceramic pressure sensors", Twelfth IEEE International conference, Orlando, FL, Jan. 17-21, 1999, pp. 511-516, XP010321771, ISBN: 978-0-7803-5195-3.

Wilcox D L et al., "The Multilayer Ceramic Integrated Circuit (MCIC) Technology: Opportunities and Challenges" Proceedings of the Internatinal Symposium on Microelectronics, XX, XX, Jan. 1, 1997, pp. 17-23, XP000862942.

Machine Translation of WO2011/104860A1, by ThomsonReuters.

* cited by examiner

100

PRESSURE SENSOR DEVICE WITH A MEMS PIEZORESISTIVE ELEMENT ATTACHED TO AN IN-CIRCUIT CERAMIC BOARD

BACKGROUND

FIG. 1 is a cross-sectional diagram of a prior art pressure sensor device 100. A metal port 102 has an exterior surface 104, threaded 106 to allow the port 102 to be attached to an orifice carrying a pressurized fluid.

A cavity 108 extends upwardly through the port 102 and is "closed" at a top side 116 by a thinned area or portion 110, above which is a conventional MEMS silicon pressure sensing element 112. Prior art MEMS silicon pressure sensing elements are disclosed in U.S. Pat. No. 6,427,539 entitled, "Strain gauge," U.S. Pat. No. 8,302,483 entitled, "Robust design of high pressure sensor device," and U.S. Pat. No. 8,171,800 entitled, "Differential pressure sensor using dual backside absolute pressure sensing," to name a few, the contents of which are incorporated herein by reference.

The thinned portion 110 has a thickness that is about 0.3 mm to about 0.4 mm. It acts as a diaphragm, deflecting upwardly and downwardly responsive to changes in the pressure of a fluid in the cavity 108.

The thinned portion 110 is generally planar. The cavity 108 below the thinned portion 110 is preferably a tube or tubular and encircles or encloses a perimeter 114, which is provided with a radius where the wall defining the tubular cavity 108 meets the thinned portion 110 to reduce stress concentrations.

The MEMS silicon pressure sensing element 112 is essentially centered above the perimeter 114. The MEMS silicon pressure sensing element 112 is attached to the top 116 of the port 102 by a glass frit 118. The glass frit 118 bonds or attaches the MEMS pressure sensing element 112 to the top surface 116 such that deflection of the thinned area 110 causes the MEMS silicon pressure sensing element to change its size and shape. When the size and shape of the piezoresistors embedded in the sensing element 112 changes, their resistance values also change, causing an output voltage from the sensing element 112 to change proportionately to the deflection of the thinned area 110.

The port 102 is surrounded by a plastic spacer 120, on top of which is a conventional printed circuit board (PCB) 122. The PCB 122 is attached to the spacer 120 by an adhesive 124. The PCB 122 supports an application-specific integrated circuit (ASIC) 130.

On the left side of FIG. 1, the spacer 120 and PCB 122 support a chip capacitor 126, which is attached to the PCB 122 by an electrically conductive adhesive 127. Thin bond wires 128 extend between the MEMS pressure sensing element 112 and the ASIC 130. Similarly, a second set of bond wires 132 extend between the ASIC 130 and bond pads 134 on the top surface of the PCB 122.

The metal from which the port 102 is made and the material from which the PCB 122 is made, have significantly different coefficients of thermal expansion. (CTE). The coefficients of thermal expansion of the glass frit 118 and MEMS pressure sensing element 112 are also significantly different from the coefficient of thermal expansion for the metal port 102. The mismatches between the CTEs create thermally-induced stresses and voltage noise. In addition to thermally-induced stresses and voltage noise, a threaded connection is difficult to seal hermetically. Reducing or eliminating the mismatch between coefficients of thermal expansions and simplifying the packaging would be an improvement over the prior art.

DETAILED DESCRIPTION

Figure 2A:
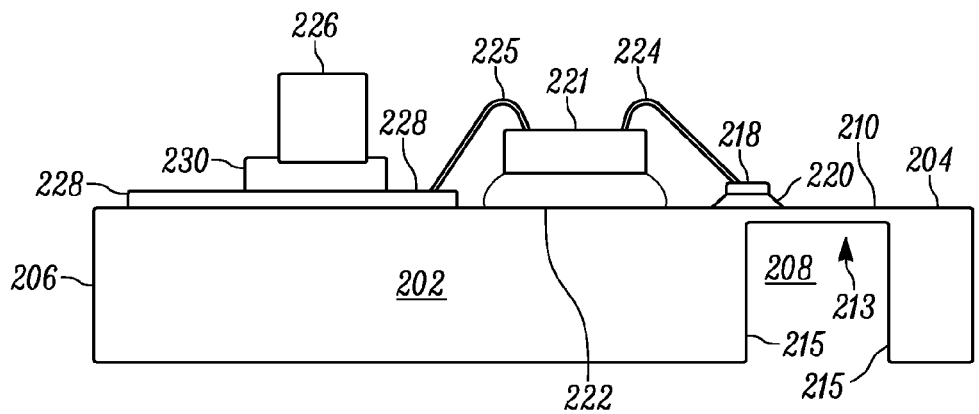
FIG. 2A is a cross-section of a first embodiment of a pressure sensor device with a MEMS piezoresistive element attached to an in-circuit ceramic board.
Figure 2B:
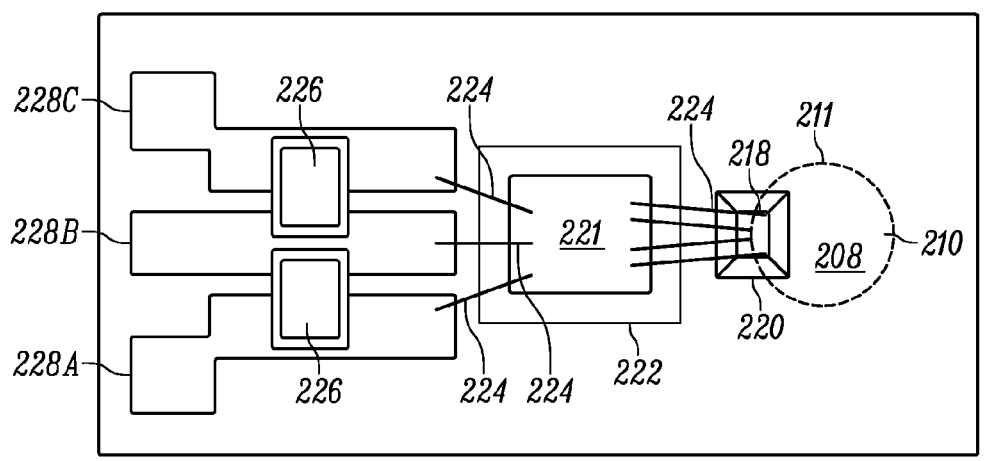
FIG. 2B is a top view of the pressure sensor device shown in FIG. 2A.

FIG. 2A is a cross-sectional view of a pressure sensor device 200, with a MEMS piezoresistive element attached to an in-circuit ceramic circuit board 202. FIG. 2B is a top view of the same pressure sensor device 200.

The pressure sensor device 200 comprises the ceramic circuit board 202 having a top side 204 and a bottom side 206. As can be seen in FIG. 2A, a cavity 208 in the bottom side 206 extends "upwardly" to a thinned area or region 210. The location and boundary of the cavity 208 in the ceramic circuit board 202, and the cross-sectional shape of the cavity 208 is demarcated in FIG. 2B by a circle drawn by dashed lines identified by reference numeral 211, which also identify the perimeter or periphery of the thinned area 210.

The thinned area 210 deflects responsive to pressure changes in the cavity 208 and thus behaves as a diaphragm. The thinned area 210 is therefore considered herein to be a diaphragm 210.

The cavity 208 is essentially a tube that is open on one end, i.e., at the bottom side 206 of the ceramic circuit board 202, and which extends part way through the ceramic circuit board 202 to the thinned area 210. The diaphragm 210 of the embodiment shown in FIGS. 2A and 2B is thus circular or substantially circular. The perimeter or peripheral edge of the diaphragm 210 is best seen in FIG. 2B and is identified by reference numeral 211.

Figure 5:
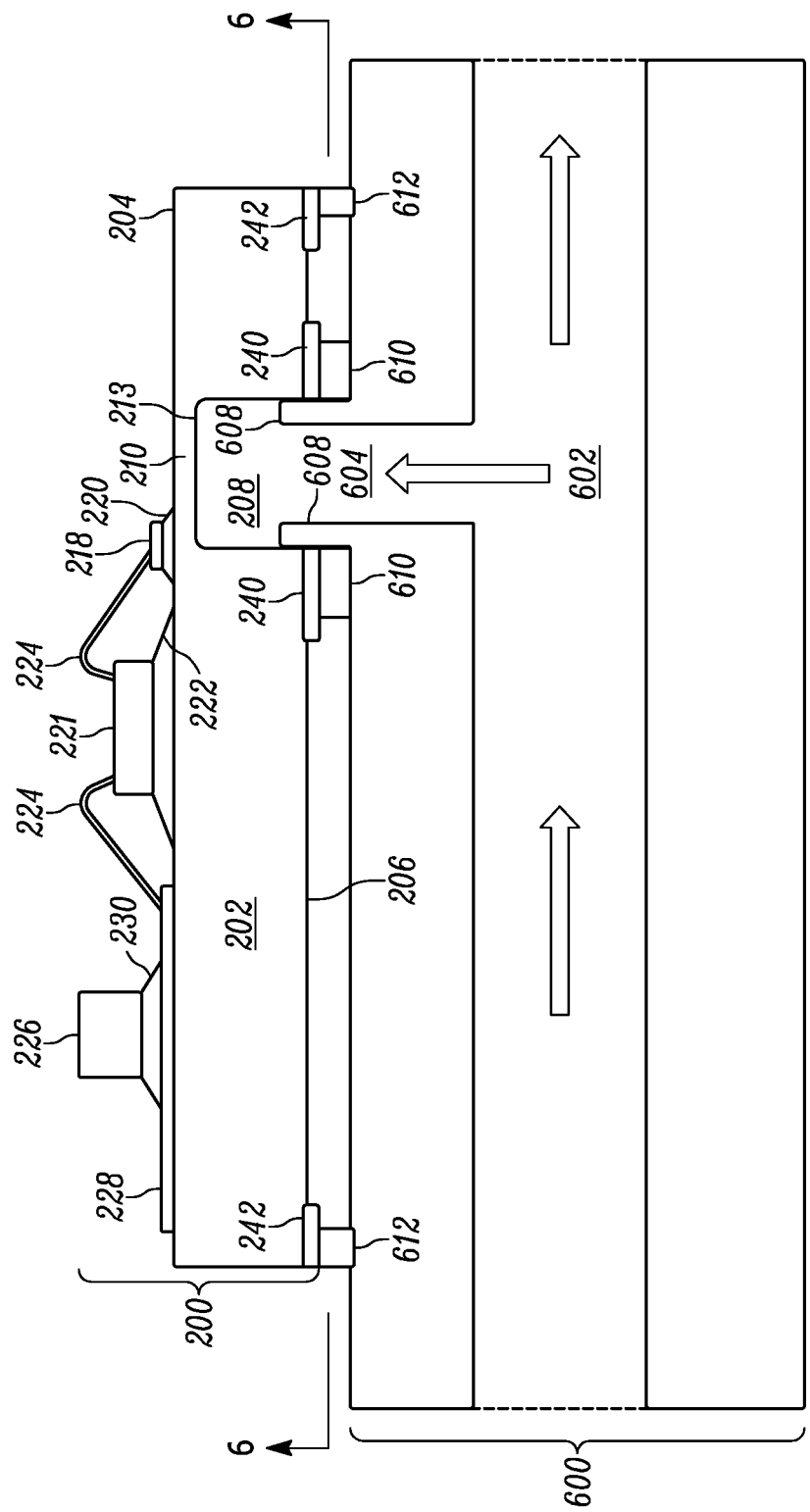
FIG. 5 depicts the pressure sensor device of FIGS. 2A and 2B attached to a conduit carrying a pressurized fluid.

Pressure is applied to the bottom side 213 of the diaphragm 210 by fluid provided into the cavity 208 by a conduit shown in cross section in FIG. 5, which causes the diaphragm 210 to deflect. Deflections of the diaphragm 210 cause a MEMS silicon pressure sensing element 218, attached to the top side 204 of the ceramic circuit board 202 by a glass frit 220 and located above the perimeter 211, to change an output voltage responsive to diaphragm deflection. The MEMS pressure sensing element 218 is substantially centered over the perimeter 211 of the diaphragm 210.

An application-specific integrated circuit (ASIC) 221 is attached to the top side 204 of the ceramic circuit board 202 by an adhesive 222, either a soft mount or a hard mount. The ASIC 220 communicates with the MEMS element 218, i.e., sends electrical signals to and receives electrical signals from the MEMS element 218, through bond wires 224.

Signals to and from the ASIC 221 are filtered by capacitors 226 attached to conductive bond pads 228A-228C by an electrically conductive adhesive (ECA) or solder 230. The capacitors 226 are thus electrically coupled to the ASIC 221. Bond wires 225 electrically interconnect the ASIC 221 to the bond pads 228A-C and connect the ASIC 221 to the capacitors 226 for electromagnetic control (EMC).

Figure 3A:
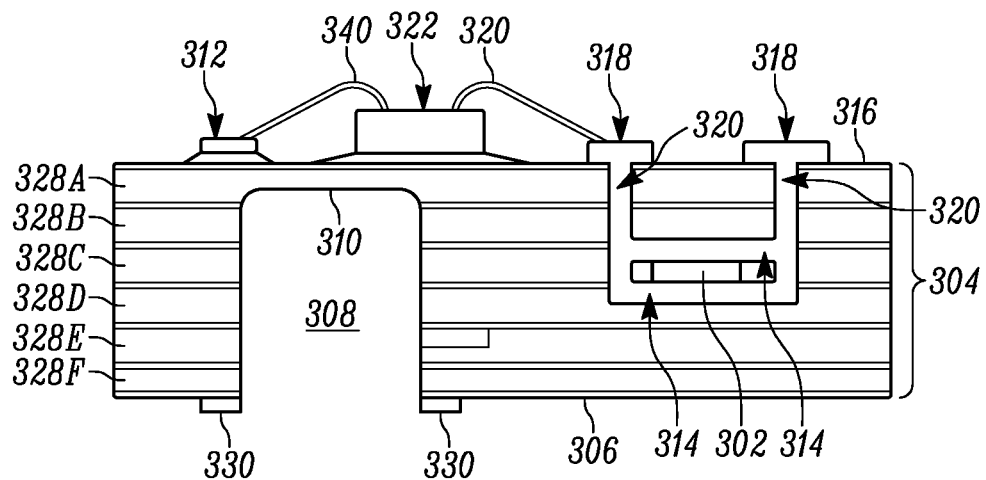
FIG. 3A is a cross-section of a second embodiment of a pressure sensor device with a MEMS piezoresistive element attached to an in-circuit ceramic board.
Figure 3B:
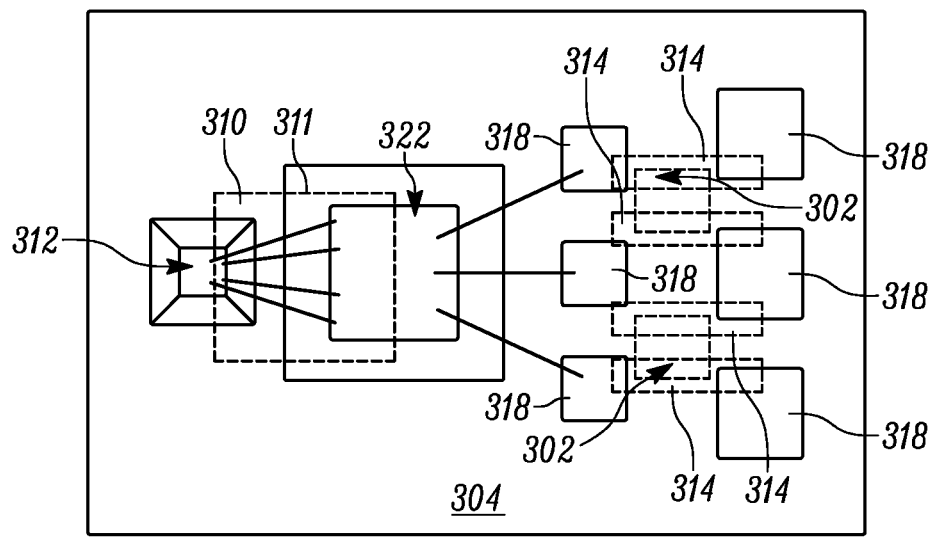
FIG. 3B is a top view of the pressure sensor device shown in FIG. 3A.

FIG. 3A is a cross-sectional view of a second embodiment of a pressure sensor device 300 with a MEMS piezoresistive element 312 attached to an in-circuit ceramic board 304. FIG. 3B is a top view of the pressure sensor device 300.

The device 300 shown in FIGS. 3A and 3B differs from the embodiment shown in FIGS. 2A and 2B by the location of filter capacitors. In FIGS. 3A and 3B, filter capacitors 302 are located inside the ceramic circuit board 304 rather than on an exterior surface as shown in FIGS. 2A and 2B. In addition to the location of the filter capacitors, the cross-sectional shape of the cavity 308 of the pressure sensor device 200 shown in FIGS. 3A and 3B is square instead of circular.

A substantially square-shaped seal 330 in FIG. 3A, preferably made of tungsten or molybdenum for high temperature co-fired ceramic (HTCC) can also be made of gold, silver or aluminum for low temperature co-fired ceramic (LTCC). The seal 330 is screen-printed onto the bottom side 306 of the ceramic circuit board 304 completely around the substantially square-shaped opening into the cavity 308. The square metal seal 330 can be soldered on a metal port for hermetic sealing.

As explained below, the cavity 308 and the square seal 330 are sized, shaped and arranged to receive a conduit that carries a pressurized fluid. An adhesive, such as solder, placed between the square seal 330 and such a conduit acts as a sealant. The square seal 330 is thus considered to be a hermetic soldered seal, which is a device that prevents pressurized fluid or fuel leakage. Pressurized fluid can thus be provided into the cavity 308, which will cause a thinned area 310, i.e., an area at "top" of the cavity referred to herein as a diaphragm, to deflect. Deflection of the diaphragm 310 thus causes a MEMS pressure sensing element 312 to produce an output voltage, which changes in magnitude responsive to deflection of the diaphragm 310.

Figure 4A:
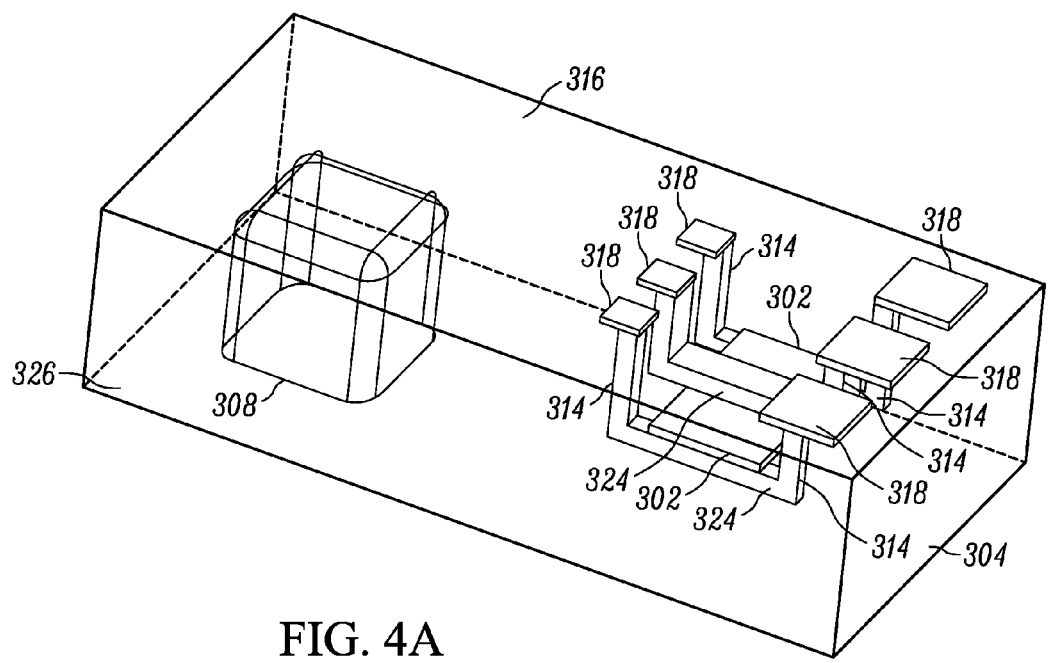
FIG. 4A is a topside perspective view of the pressure sensor device shown in FIGS. 3A and 3B.

As can be seen in FIG. 4A, internal capacitors 302 are actually embedded in the ceramic circuit board 304. The internal capacitors 302 are attached to conductive traces 324 that are connected to conductive vias 314, which extend downwardly from the top surface 316 of the ceramic circuit board 304 where the conductive vias are connected to bond pads 318. As can be seen in FIG. 3A, flexible bond wires 320 extend between an application-specific integrated circuit (ASIC) 322 on the top surface 316 and the bond pads 318. Bond wires 340 electrically interconnect the MEMS 312 to the ASIC 322.

Figure 4B:
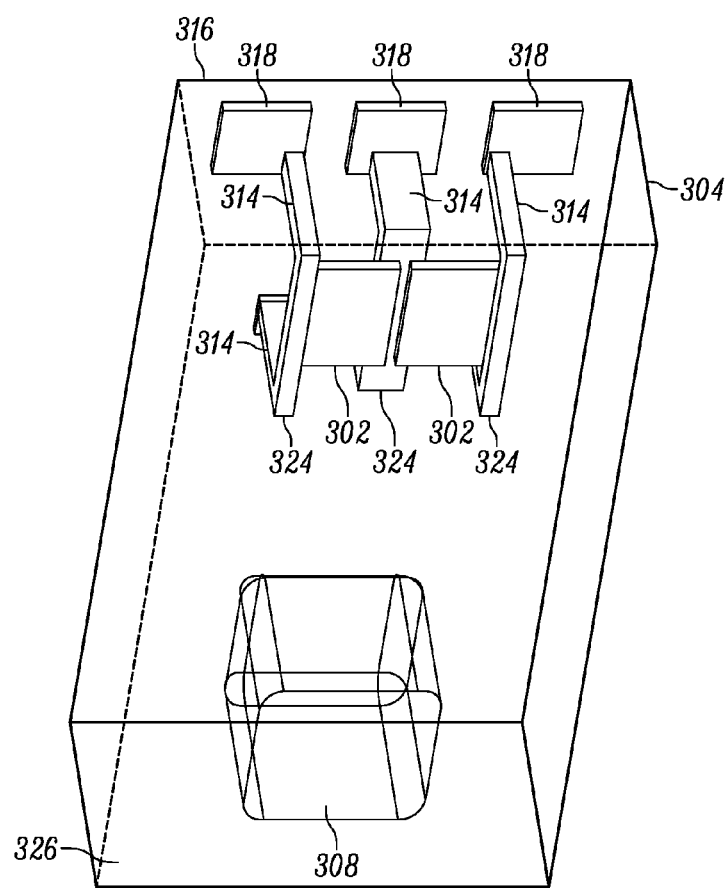
FIG. 4B is a backside perspective view of the pressure sensor device shown in FIGS. 3A and 3B.

On the left side of FIG. 4A, the cavity 308 is shown extending from the bottom surface 326 of the ceramic circuit board 304. The bottom surface 326 or "backside" of the ceramic circuit board 304 is depicted in FIG. 4B. Together, FIGS. 4A and 4B depict how the internal capacitors 302 are connected to the conductive traces 324, conductive vias 314 and the bond pads 318 on the top surface 316, which provide connections for input voltage, ground, and output voltage. The embodiment of the pressure sensor device 300 shown in FIGS. 3A and 3B additionally differs from the embodiment shown in FIGS. 2A and 2B by the location of the ASIC 322. In FIGS. 3A and 3B, the ASIC 322 is located on the top surface 316 such that at least a portion of the ASIC is inside a perimeter 311 of the diaphragm 310 whereas in FIGS. 2A and 2B, the ASIC is outside the perimeter of the diaphragm.

The ceramic circuit board in FIGS. 2A and 2B and the ceramic circuit board shown in 3A and 3B are both formed from several thin layers of ceramic. The layers of ceramic that are stacked on top of each other are omitted from FIGS. 2A and 2B for clarity but are clearly identified in FIG. 3A by reference numerals 328A-F. In embodiments of the sensors shown in FIGS. 2A, 2B, 3A and 3B, a monolithic ceramic circuit board is formed from multiple layers of a low temperature co-fired ceramic (LTCC). In other embodiments, the monolithic ceramic circuit board is formed from multiple layers of high temperature co-fired ceramic (HTCC).

As can be seen in FIG. 3A, lower layers 328B-F have openings in them, square or circular, which when stacked on top of each other form the cavities described above. The top layer 328A, however, does not have an opening and thus comprises the diaphragms described above.

Regardless of whether the ceramic is a low temperature or high temperature fired ceramic, and regardless of the shape of the openings in the layers, the multiple layers of ceramic material are heated to a temperature at which the various layers fuse together and become a single monolithic ceramic layer. In the embodiment shown in FIGS. 3A and 3B, the internal capacitors 302 are embedded within an opening of one or more layers 328.

FIG. 5 shows the attachment of the pressure sensor device 200 shown in FIGS. 2A and 2B to a conduit 600, configured to carry a pressurized fluid 602. Since the pressure sensor device 200 has a circular cavity 208, the conduit 600 has a substantially circular protrusion 608 inside the cavity 208 opening from the bottom side 206 of the ceramic circuit board 202.

A conduit port 604, which extends into the cavity 208 of the pressure sensor device 200, carries pressurized fluid 602 into the cavity 208 and against the ceramic diaphragm 210. The metal ring 240 located in either a recess formed in the or on the surface of the bottom side 206 of the ceramic circuit board 202 is sealed and bonded to the port 604 by either an adhesive or solder 610. Additionally, metallization areas 242 on the perimeter of ceramic circuit board 202 allow solder 612 for attachment to metal conduit 600 for additional support.

Figure 6:
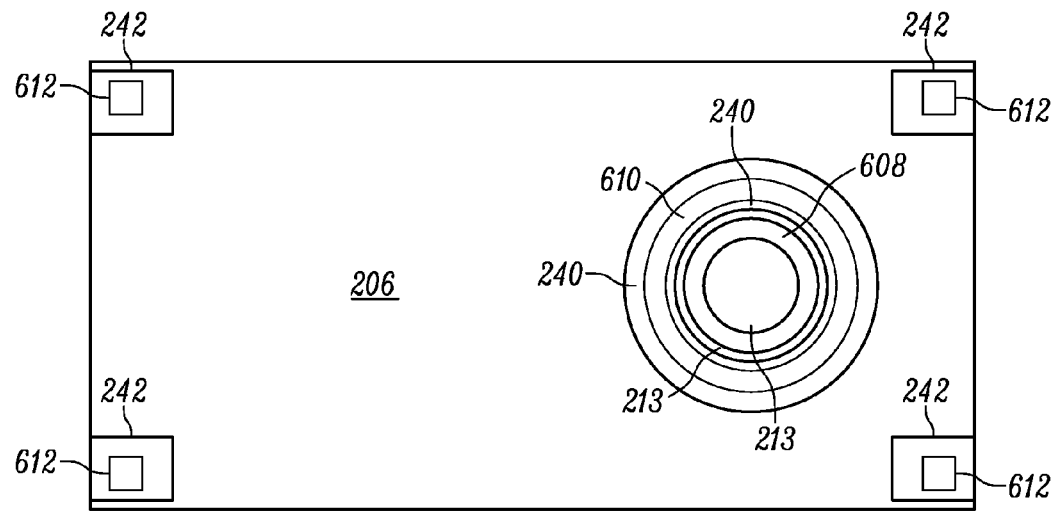
FIG. 6 is a cross-sectional view of the pressure sensor device shown in FIG. 5.

FIG. 6, a plan view 6-6 of the pressure sensor device 200 shown in FIG. 5, taken through section lines 6-6. FIG. 6 thus shows the metal ring 240, the metallization areas 242, the solders 610 and 612, the circular protrusion 608, and portion of the backside 213 of the diaphragm 210. The cavity 208 of the first embodiment 200 is surrounded by the metal ring 240. Since the cross-section of the cavity 208 is circular, the cavity 208 is considered to be a cylinder or tube.

Figure 7:
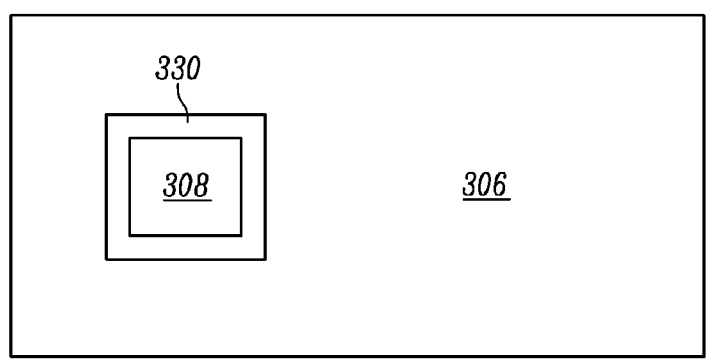
FIG. 7 is a bottom view of the pressure sensor device shown in FIGS. 3A and 3B.

The embodiment shown in FIGS. 3A and 3B has a cavity 308 with a cross-section that is square or substantially square. The seal 330 around the cavity's opening 308 in the bottom side 306 of the ceramic circuit board 304 is thus picture frame-shaped, substantially as shown in FIG. 7.

Figure 1:
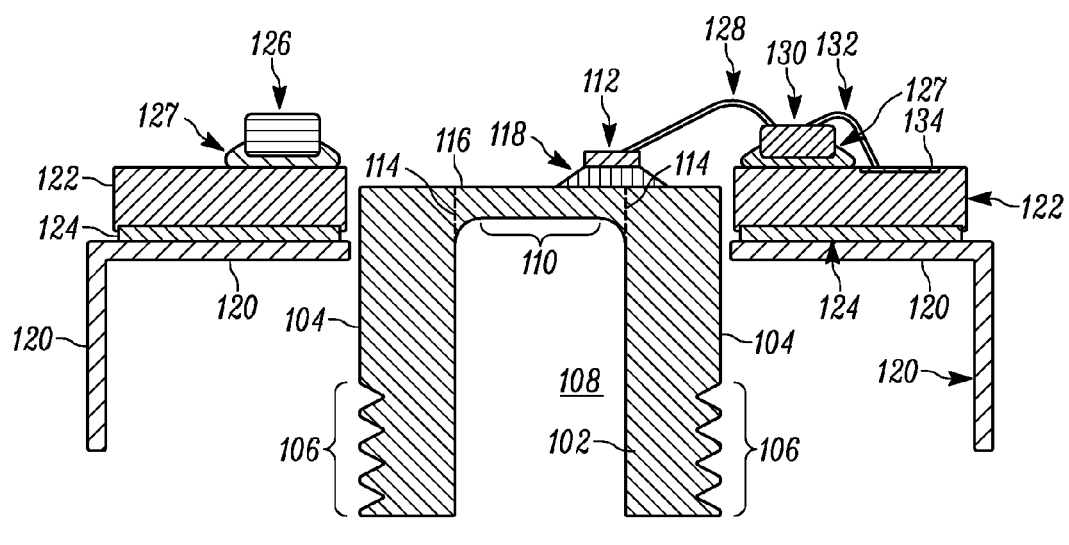
FIG. 1 is a cross-section of a prior art pressure sensing device.

The prior art shown in FIG. 1 attaches a MEMS piezoresistive pressure sensing element made of silicon onto a metal port, which creates higher thermal mismatch between the silicon and the metal. Unlike prior art pressure sensor devices, the pressure sensor devices shown in FIGS. 2A and 2B and FIGS. 3A and 3B attach a MEMS piezoresistive pressure sensing element onto a ceramic circuit board, which has lower thermal mismatch between the silicon and the ceramic. In addition to the performance improvement, the invention simplifies the packaging by integrating a metal port and a conventional printed circuit board (PCB) in the prior art into a single in-circuit ceramic board. The packaging size is thus further reduced.

The foregoing description is for purposes of illustration only. The true scope of the invention is set forth in the following claims.

What is claimed is:

1. A MEMS piezoresistive pressure sensor device comprising:
   a ceramic circuit board having a top side and a bottom side, the bottom side having a cavity, which extends through the ceramic circuit board to a ceramic diaphragm having a peripheral edge, the ceramic diaphragm having a thickness selected to enable the ceramic diaphragm to deflect responsive to an applied pressure;
   a MEMS piezoresistive pressure sensing element attached to the top side of the ceramic diaphragm by a layer of glass frit, the MEMS piezoresistive pressure sensing element being substantially centered over the ceramic diaphragm peripheral edge, the MEMS piezoresistive pressure sensing element configured to generate an output signal responsive to deflection of the ceramic diaphragm.

2. The pressure sensor device of claim 1, further comprising a metal seal coupled to the bottom side of the ceramic circuit board and surrounding the cavity where the cavity meets the bottom side.

3. The pressure sensor device of claim 1, further comprising an integrated circuit attached to the top side of the ceramic circuit board and located outside the perimeter of the diaphragm.

4. The pressure sensor device of claim 1, further comprising an integrated circuit attached to the top side of the ceramic circuit board and located whereby at least part of the integrated circuit is within the perimeter of the diaphragm.

5. The pressure sensor device of claim 1, further comprising an adhesive between the MEMS piezoresistive pressure element and the top side of the ceramic circuit board.

6. The pressure sensor device of claim 1, wherein the ceramic circuit board further comprises at least one capacitor, which is internal to the ceramic circuit board, between the top and bottom surfaces, the at least one capacitor being electrically coupled to the integrated circuit.

7. The pressure sensor device of claim 1, further comprising at least one capacitor attached to the top surface, the at least one capacitor being electrically coupled to the integrated circuit.

8. The pressure sensor device of claim 1, wherein the ceramic circuit board comprises a monolithic ceramic layer, formed from a first plurality of layers of low-temperature co-fired ceramics.

9. The pressure sensor device of claim 1, wherein the ceramic circuit board comprises a monolithic ceramic layer, formed from a first plurality of layers of high-temperature co-fired ceramics.

10. The pressure sensor device of claim 1, further comprising a plurality of bond pads on the top side of the ceramic circuit board.

11. The pressure sensor device of claim 1, further comprising a conduit, configured to carry a pressurized fluid, the conduit having a port, which extends into the ceramic cavity and applies a pressurized fluid against the diaphragm.

12. The pressure sensor device of claim 11, wherein the conduit is metal.

13. The pressure sensor device of claim 11, further comprising an adhesive seal between the port and the cavity.

14. The pressure sensor device of claim 13, wherein the adhesive seal is a solder.

15. The pressure sensor device of claim 1, wherein the ceramic diaphragm is circular.

16. The pressure sensor device of claim 1, wherein the ceramic diaphragm is rectangular.

* * * * *